(12) United States Patent
Cho et al.

(10) Patent No.: US 7,782,591 B2
(45) Date of Patent: Aug. 24, 2010

(54) METHODS OF AND APPARATUS FOR REDUCING AMOUNTS OF PARTICLES ON A WAFER DURING WAFER DE-CHUCKING

(75) Inventors: Sangjun Cho, Pleasanton, CA (US); Sean Kang, San Ramon, CA (US); Tom Choi, Santa Clara, CA (US); Taejoon Han, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 546 days.

(21) Appl. No.: 11/821,314

(22) Filed: Jun. 22, 2007

(65) Prior Publication Data
US 2008/0314733 A1      Dec. 25, 2008

(51) Int. Cl.
*H05F 3/00*    (2006.01)
(52) U.S. Cl. ........................................ 361/226; 204/164
(58) Field of Classification Search ................. 361/226; 438/763, 732, 718; 204/164
See application file for complete search history.

(56) References Cited

U.S. PATENT DOCUMENTS

| | | | | |
|---|---|---|---|---|
| 5,622,595 A | * | 4/1997 | Gupta et al. | 438/710 |
| 5,779,807 A | * | 7/1998 | Dornfest et al. | 134/1.2 |
| 6,185,085 B1 | * | 2/2001 | Hwang et al. | 361/234 |
| 6,214,160 B1 | * | 4/2001 | Dornfest et al. | 156/345.28 |
| 6,252,758 B1 | | 6/2001 | Nagao et al. | 361/234 |
| 2005/0272227 A1 | * | 12/2005 | Moriya et al. | 438/474 |
| 2007/0258185 A1 | * | 11/2007 | Retzlaff | 361/234 |

FOREIGN PATENT DOCUMENTS

| | | |
|---|---|---|
| JP | 2000-003902 | 1/2000 |
| JP | 2000-049100 | 2/2000 |

* cited by examiner

*Primary Examiner*—Stephen W Jackson
*Assistant Examiner*—Angela Brooks
(74) *Attorney, Agent, or Firm*—Martine Penilla & Gencarella, LLP (57) ABSTRACT

Particles are trapped away from a wafer transport zone in a chamber. A first electrode is on one side of the zone. A second electrode is on an opposite side of the zone. A power supply connected across the electrodes establishes an electrostatic field between the electrodes. The field traps particles at the electrodes, away from the zone. For transporting the wafer from the chamber, the second electrode mounts the wafer for processing, and the first electrode is opposite to the second electrode defining a process space. The zone is in the space with a separate part of the space separating the zone from each electrode. Particles are urged away from the wafer by simultaneously terminating plasma processing of the wafer, connecting the second electrode to ground, applying a positive DC potential to the first electrode, and de-chucking the wafer from the second electrode into the zone.

18 Claims, 5 Drawing Sheets

METHODS OF AND APPARATUS FOR REDUCING AMOUNTS OF PARTICLES ON A WAFER DURING WAFER DE-CHUCKING

BACKGROUND

In the fabrication of semiconductor devices such as integrated circuits, memory cells, and the like, a series of manufacturing operations is performed to define features on semiconductor wafers ("wafers"). These operations are performed in a process chamber supplied with gas at a low pressure. Various voltages, such as RF voltages, are applied to one or more electrodes in the chamber to establish a plasma to perform the operations, including etching and deposition, for example. During these operations, the wafer is held securely in the chamber by an electrostatic chuck (ESC). ESCs are configured with one or more electrodes to which a voltage is applied. The voltage induces charges that urge the wafer against the ECS. Other voltages are applied for separating the wafer from the ESC, an operation known as de-chucking.

During the life of an ESC, repeated application of these applied voltages tends to deteriorate the ESC. As a result, particles of the ESC may flake off the ESC and become loose in the chamber. The plasma may also be a source of particles. As semiconductor integrated circuit technology transitions to sub-100 nanometer scale manufacturing, the presence of undesired particles in such chambers becomes more of a problem, by reducing yields, for example.

In view of the forgoing, there is a need for reducing the amount of particles in the chamber, including reducing the amount of particles that may settle on the wafer during a de-chucking operation.

SUMMARY

Broadly speaking, the present invention fills these needs by reducing the amount of particles in a process chamber. More specifically, these needs are filled when the process chamber is configured with a zone in which a wafer is transported out of the process chamber. Electrodes are mounted in the chamber, and are biased to effect wafer processing. In connection with a wafer de-chucking operation, the bias is changed from a processing state to a transport state, and the newly-biased electrodes are effective to establish a field across a transport zone in which the wafers are to be removed from the chamber. The field causes particles in the transport zone to move out of the transport zone, reducing the amount of particles surrounding or touching the wafer as the wafer is de-chucked. During the transport of the processed and de-chucked wafer out of the chamber, due to the reduced amount of particles surrounding or touching the wafer, the processed wafer is subjected to fewer particles and exits the chamber in a cleaner condition than if the particles had been allowed to remain in the zone and allowed to settle on the wafer during the de-chucking and transporting operations.

It should be appreciated that the present invention can be implemented in numerous ways, including as an apparatus, a method and a system. Several inventive embodiments of the present invention are described below.

In one embodiment, apparatus is provided for trapping particles away from a wafer transport zone in a process chamber after plasma processing of the wafer. A first electrode is mounted in the process chamber on one side of the transport zone. A second electrode is mounted in the chamber spaced from the first electrode on an opposite side of the transport zone. A power supply is connected across the first and second electrodes to establish an electrostatic field between the electrodes and across the transport zone. The field traps particular ones of the particles at a particular one of the electrodes so that particles in the chamber are urged away from the transport zone.

In another embodiment, apparatus reduces an amount of particles in a transport zone in a process chamber after plasma processing of a wafer. The apparatus is configured for operation in two states, a first state being a state for processing the wafer, and a second state being a wafer transport state for removing the processed wafer from the chamber. A first multi-state electrode is mounted in the process chamber. A second multi-state electrode is mounted in the chamber spaced from the first electrode. The second electrode is configured to de-chuck the wafer into the transport zone after wafer processing. An electrode bias controller is configured to bias the electrodes for operation in each of the states. For example, for the wafer transport state the controller is configured to simultaneously connect the second electrode to ground, apply a positive DC potential to the first electrode, and cause the second electrode to de-chuck the wafer to facilitate positioning the wafer in the transport zone.

In yet another embodiment, a method is provided for preparing a process chamber for transporting a processed wafer from the process chamber. A support electrode may mount the wafer for the processing. The processing tends to release undesired particles into a process space in the chamber. A second electrode is opposite to the support electrode and defines the process space. Operations of the method may include defining a wafer transport zone in the process space so that a separate part of the process space separates the zone from each of the electrodes. The particles are urged away from the wafer by simultaneously performing further operations of terminating plasma processing of the wafer, connecting the support electrode to ground, applying a positive DC potential to the second electrode, and de-chucking the wafer from the support electrode into the transport zone.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for apparatus, systems for use, and methods for reducing the amount of particles in a process chamber. The process chamber is configured with a zone in which a wafer is transported out of the process chamber. Electrodes are mounted in the chamber, and are biased to effect wafer processing. In connection with a wafer de-chucking operation, the bias is changed from a processing state to a transport state. The newly-biased electrodes are effective to establish a field across a transport zone in which the wafers are to be removed from the chamber. The field urges undesired particles out of the transport zone, reducing the amount of particles surrounding or touching the wafer as the wafer is de-chucked into the zone. During the transport of the processed and de-chucked wafer in the zone and out of the chamber, the urged particles that are out of the transport zone do not touch the wafer. As a result, the processed wafer may exit the chamber in a cleaner condition than if the particles had been allowed to remain in the transport zone and had the undesired particles settled on the wafer during the de-chucking and transporting operations.

It will be obvious, however, to one skilled in the art, that the present invention may be practiced without some or all of these specific details. In other instances, well known process operations have not been described in detail in order not to unnecessarily obscure the present invention.

The word "wafer," as used herein, denotes without limitation, semiconductor substrates, hard drive disks, optical discs, glass substrates, and flat panel display surfaces, liquid crystal display surfaces, etc., on which materials or layers of various materials may be formed or defined in a processing chamber, such as a chamber in which a plasma is established for processing, e.g., etching or deposition.

Figure 1:
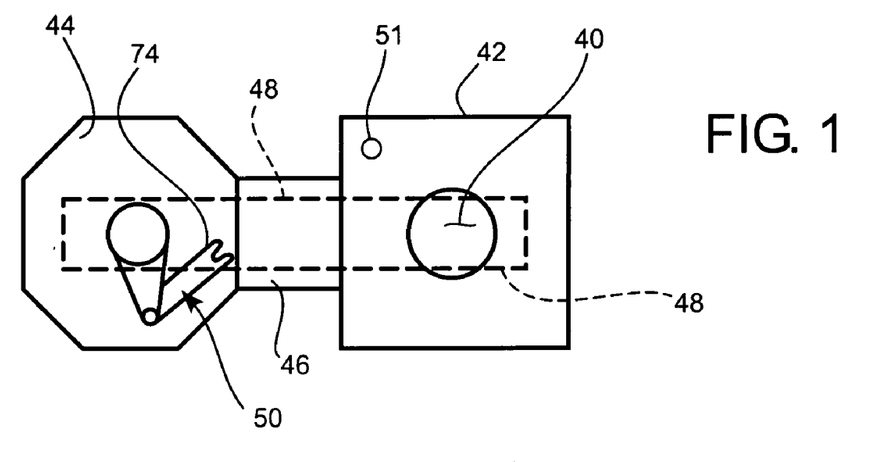
FIG. 1 is a schematic plan view of a cluster-type architecture for processing wafers according to the present invention.

FIG. 1 is a schematic plan view of a cluster-type architecture for processing wafers 40 according to the present invention. One of many processing chambers (or modules) 42 is shown arranged around a transport module 44. A gate valve 46 between each of the process modules 42 and the transport module 44 is used to maintain an environment in the respective modules 42 and 44 to facilitate the transport of the wafer 40 into the processing module 42. Also facilitated is the wafer processing in such module 42 by separating the processing chamber 42 from the transport module 44. Opening the gate valve 46 again facilitates the transport of the processed wafer 40 from the processing chamber 42. A transport zone 48 is shown in dashed lines in plan view in FIG. 1 and in elevation in FIG. 2. The transport zone 48 is thus an elongated three-dimensional volume extending from the process module 42 into the transport module 44. A transport unit 50 is shown in FIG. 1 for moving a wafer 40 into, and a processed wafer from, the chamber 42. The processing in the chamber 42 may use semiconductor integrated circuit technology. As that technology transitions to sub-100 nanometer scale manufacturing, the presence of undesired particles 51 in the chamber 42 has become more of a problem, by reducing yields, for example.

Figure 2:
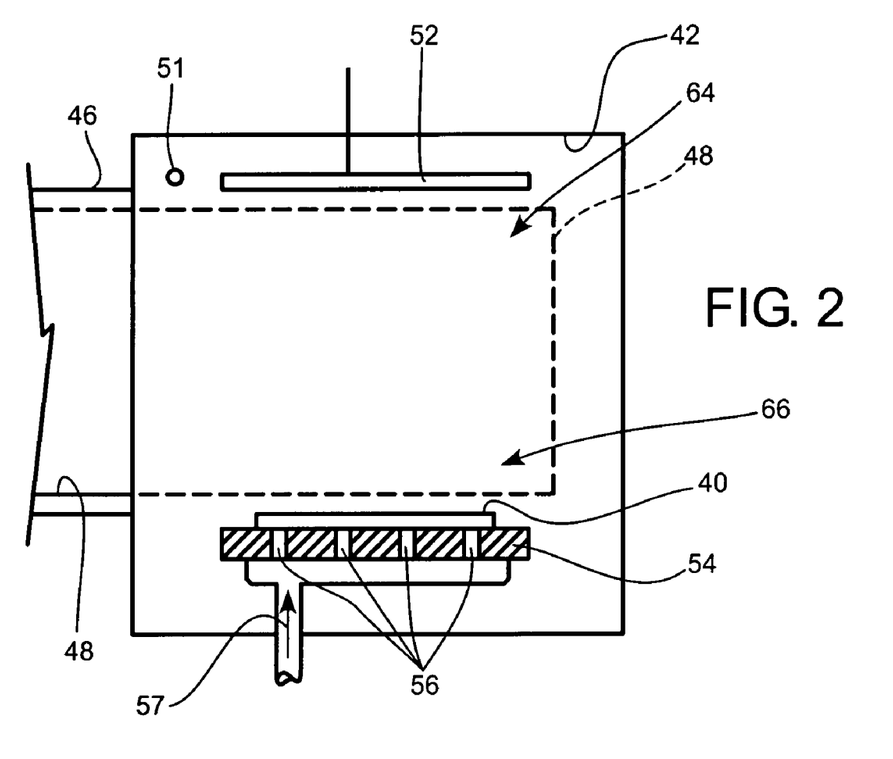
FIG. 2 is a schematic elevational view of a processing chamber of the architecture, showing the chamber configured to reduce the effect of undesired particles in the chamber in accordance with one embodiment of the present invention.

FIG. 2 is a schematic elevational view of one of the processing chambers 42, showing the chamber 42 configured to reduce the effect of undesired particles 51 in the chamber 42. FIG. 2 illustrates the height of the three-dimensional transport zone 48 extending in the chamber 42 below a first (or upper) electrode 52. The zone 48 is shown extending from the first electrode 52 down to a second (or lower) electrode 54. The transport zone 48 is configured with the height extending between the electrodes 52 and 54. A space of about 12 mm may be between each electrode 52 and 54 and the zone 48.

FIG. 2 thus shows the first electrode 52 mounted in the process chamber 42 on one side (an exemplary upper side) 64 of the transport zone 48. FIG. 2 also shows the second electrode 54 mounted in the chamber 42 spaced from the first electrode 52 on an opposite side (an exemplary lower side) 66 of the transport zone 48.

Figure 3:
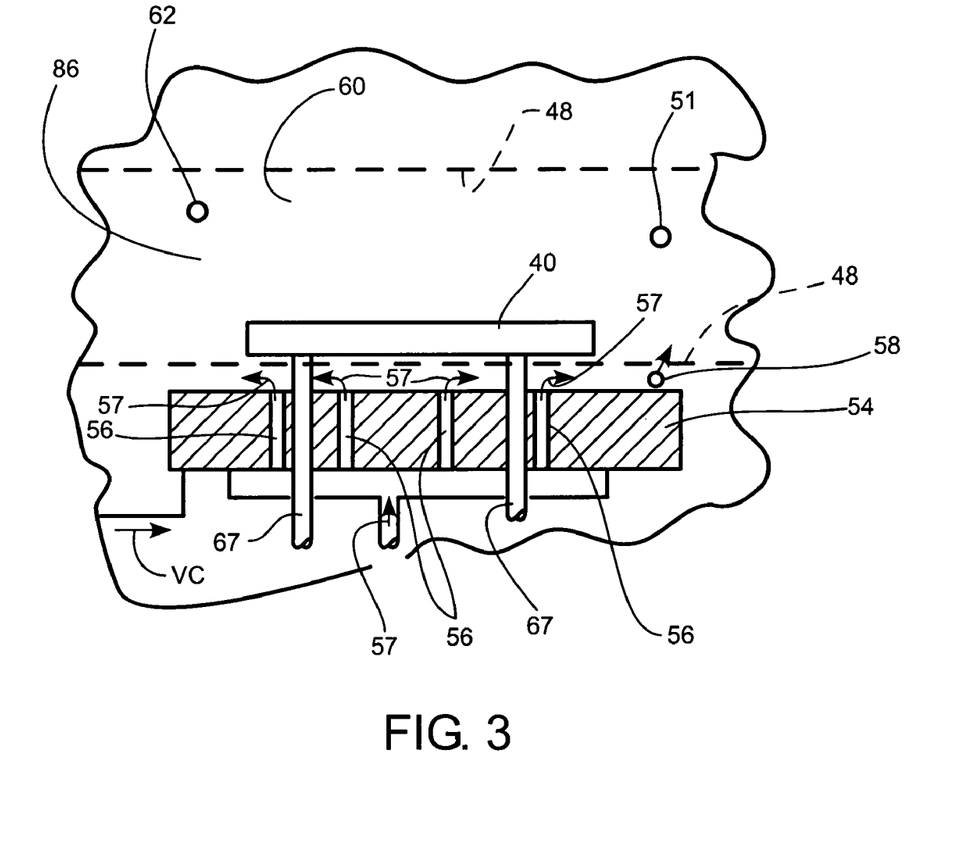
FIG. 3 is an enlarged view of a portion of FIG. 2, showing gas and lifter pins lifting the wafer off a second electrode in accordance with one embodiment of the present invention.

FIG. 3 shows that the second electrode 54 may be configured as an electrostatic chuck (ESC) that is biased by a voltage VC to electrostatically mount the wafer and retain the wafer 40 on the second electrode 54 for the processing. The voltage VC is referred to as a chucking voltage, or chucking bias. The configuration of the second electrode 54 may include passages 56 through which a gas (arrows 57) such as helium is supplied. The exemplary helium gas 57 may be supplied in connection with discontinuing the chucking bias, following a plasma de-chucking process that discharges most chucking voltage VC using an Argon plasma, for example. In this example, after the Argon plasma de-chucking, by the exemplary helium de-chucking operation, the gas 57 may overcome residual forces that tend to retain the wafer 40 on the second electrode 54 after the chuck bias is decreased or removed. FIG. 3 shows that with suitable reduction of the chucking voltage VC and with supply of the gas 57 at a controlled pressure, the gas 57 lifts the wafer 40 off the second electrode 54 to facilitate wafer movement into the transport zone. The wafer is thus released from the chuck 54. The lifted wafer 40 is said to float above the second electrode 54. The lifted (released) wafer 40 is shown in FIG. 3 having been lifted further by lifting pins 67 and having entered the transport zone 48. FIG. 3 shows the wafer in an up position, in condition for pickup by the transport unit 50.

Analysis of the life of an ESC conducted by Applicants of the present invention revealed that repeated application of the bias voltage VC to the ESC and removal of the bias voltage from the ESC 54 causes friction between the upper ESC surface and the wafer lower (back) surface that is supported by the upper ESC surface. Such friction tends to deteriorate the ESC. The analysis indicated that particles 58 (FIG. 3) of the ESC may flake off the ESC. The flaked-off particles 58 may enter the transport zone 48, where the particles 58 are referred to as "undesired" particles 51, and may become loose in the chamber 42. The processing of the wafer 40 was also studied, including effects of a plasma 60 that may be established in the chamber 42 for wafer processing (e.g., etching) and other purposes. Such analysis also indicated that the plasma 60 may also be a source of other particles 62 in the transport zone 48 within the chamber 52. Such analysis also revealed that the particles 58 from the plasma 60 may be negatively charged. Further, such Applicants identified the particles 58 from the ESC as being positively charged.

Figure 4:
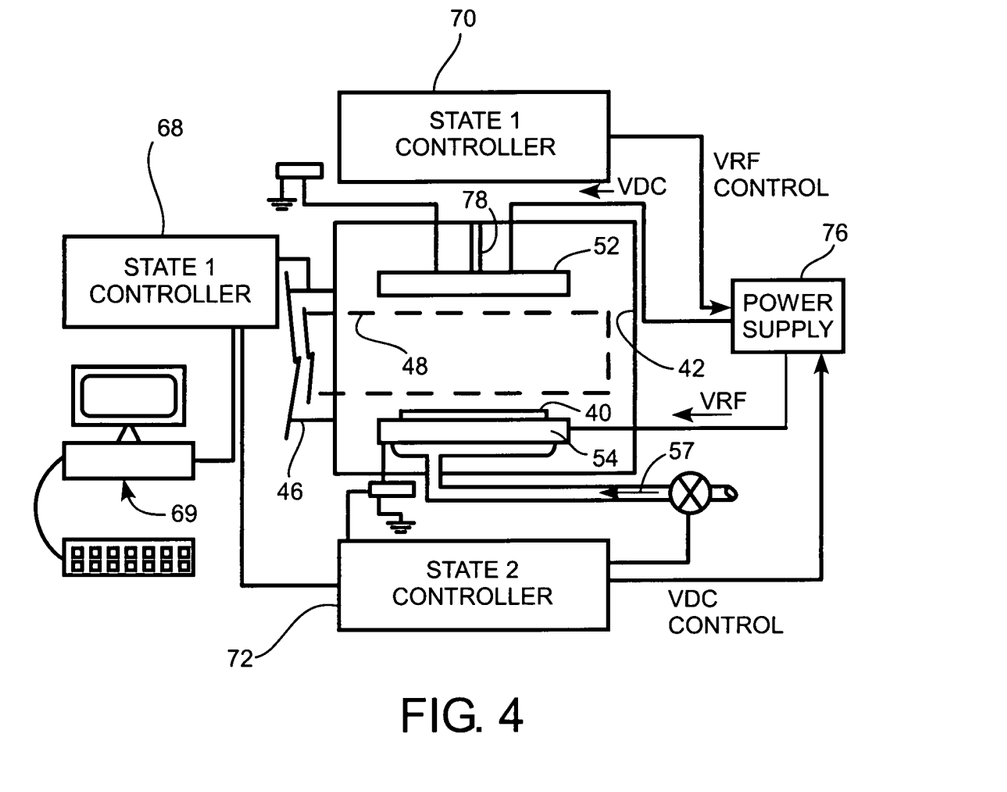
FIG. 4 is a schematic view of a portion of FIG. 2, showing that in a transport state a controller controls a value of a positive voltage on a first electrode so that charged particles are urged away from the lifted wafer and urged out of the transport zone.

To reduce amounts of the undesired particles 51 in the chamber 42 following wafer processing, and in a general sense, FIG. 4 shows one embodiment of the present invention in which the first electrode 52 may be configured as a multi-state electrode mounted in the process chamber 42. Similarly, in such embodiment the second electrode 54 may be configured as a multi-state electrode mounted in the chamber 42 spaced from the first electrode 52. An electrode bias controller 68 may control configuration of the multi-state aspects of the electrodes 52 and 54. The controller 68 is configured to bias the electrodes 52 and 54 for operation in each of two exemplary states. A first of the states (or state 1) is a process state in which the controller 68 activates a state 1 controller 70. The operations of state 1 controller 70 may include operations of a program for performing a transport recipe R using a personal computer 69. Thus, state 1 controller 70 may initially control the gate valve 46 to facilitate transport of the wafer 40 into one of the processing chambers 42, and then to separate that processing chamber 42 from the transport module 44. With the valve 46 open, the transport unit 50 may move in the transport zone 48 to deliver the wafer from the transport module 44 to the process chamber 52, placing the wafer on the ESC 54. State 1 controller 70 is also configured to cause application of an RF potential VRF to the ESC 54 and to connect the first electrode 52 to ground. In state 1, the controller 70 thus energizes the ESC 54 with a suitable value of the potential VRF (e.g., 2, 27, or 60 MHz), and the plasma 60 is established in the chamber 42 for processing the wafer 40, e.g., for a typical etching process.

A second of the states (or state 2) is a transport (or wafer transport) state in which the controller 68 is configured to start a state 2 controller 72 and to cause state 1 controller 70 to terminate operation of plasma processing of the wafer 40. Simultaneously with termination of that plasma processing and a resulting switching off of the state 1 electrode bias VRF (i.e., terminating that bias), the second state controller 72 initiates a change to state 2 bias. In state 2 bias, the controller 72 connects the second electrode 54 to ground and applies a positive DC potential VDC to the first electrode 52. FIG. 4 shows that in the transport state (state 2), via the operation initiated by the controller 68, the state 2 controller 72 controls a value of the positive voltage VDC potential so that charged particles 58 and 64 in the chamber 42 are urged away from the wafer 40 and out of the transport zone 48 to condition the transport zone 48 for moving the wafer 40 out of the chamber 42. The word "condition" refers to the transport zone 48 containing, or having therein, a reduced amount of particles 51 as compared to an amount of particles 51 in the zone 48 in state 1, for example. With respect to the negatively charged particles 62, for example, the urging away is toward and to the upper electrode 52. The positive potential VDC is selected to retain the negative particles 62 at the upper electrode 52 until removed, such as by a waferless auto cleaning process after completion of the plasma etching and removal of the wafer from the chamber 42. With respect to the positively charged particles 58, for example, the urging away from the wafer 40 is a repelling of the particles 58 downwardly back to and into the chuck 54 until removed as described above.

Figure 5:
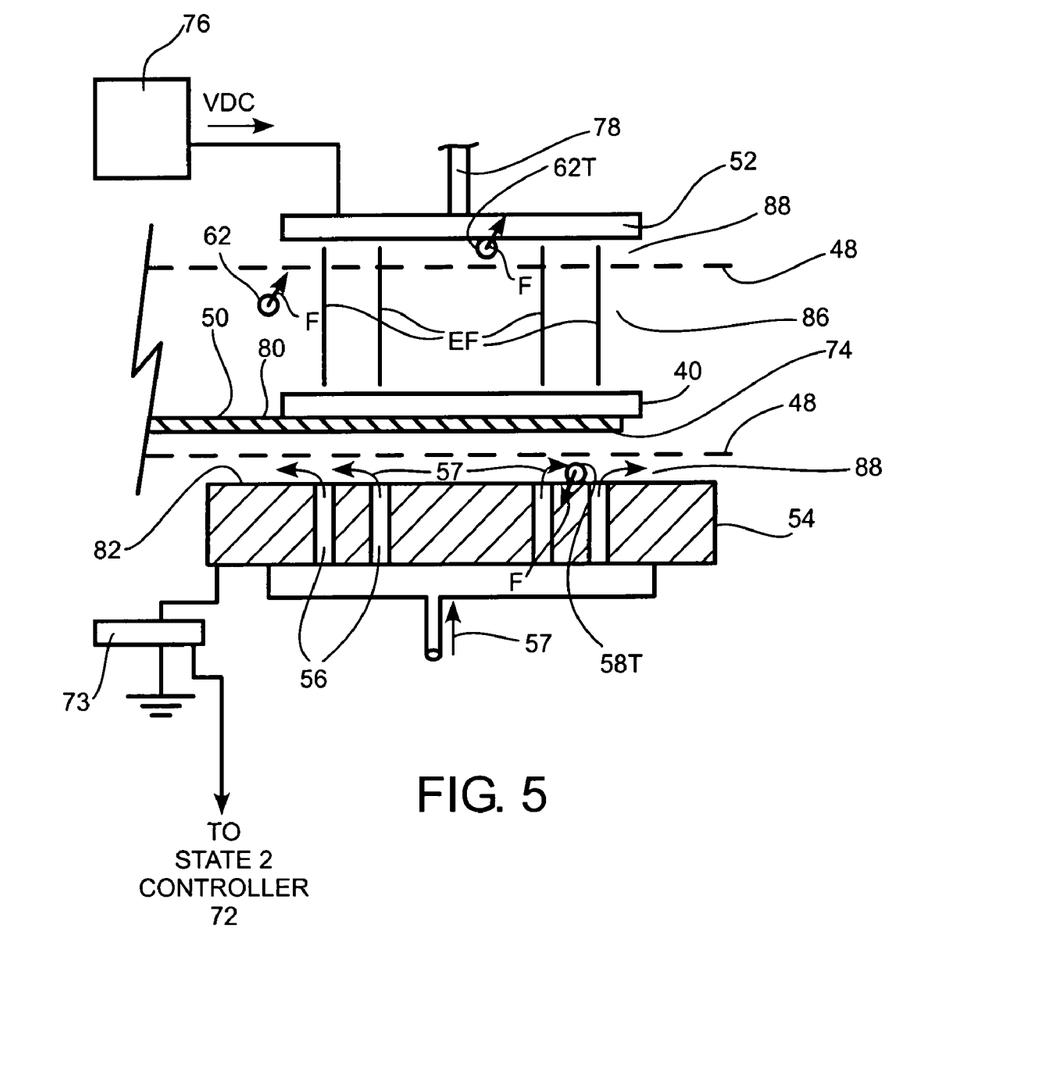
FIG. 5 shows the controller configured so that the positive voltage is applied to the first electrode in a range of volts in one embodiment of the present invention.

Operations in state 2 under control of state 2 controller 72 include discontinuing the chucking bias. For example, the value of the chucking voltage VC may be decreased to initiate a de-chucking operation. As the value of VC decreases, the gas 57 is supplied to the passages 56. The gas 57 overcomes residual forces that tend to retain the wafer 40 on the second electrode 54 after the chuck bias VC is sufficiently decreased or removed. The supply of the gas 57 to the passages 56 thus overcomes the holding force of the ECS 54 on the wafer 40 (i.e., overcomes the holding force that is toward the electrostatic chuck 54). In FIG. 5 the wafer 40 is shown having been moved upwardly into the transport zone 48 by the gas 57 and the pins 67 (FIG. 3). As the positive particles 58 are repelled to the lower electrode 54, the wafer 40 (that is now in the transport zone 48) is subjected to reduced amounts of undesired particles 51.

The control by the state 2 controller 72 of a value of the positive voltage VDC potential (i.e., to urge the charged particles 58 and 64 in the chamber 42 away from the wafer 40 and out of the transport zone 48) results in the establishment of an electric field (see lines EF in FIG. 5) between the electrodes 52 and 54 and across the transport zone 48. The field EF applies an electrostatic force F on charged particles 58 and 62 that are between the electrodes 52 and 54. The force F on the positively charged particles 58 (downwardly as shown in FIG. 5) traps positively charged particles 58 by holding the particles 58 to the electrostatic chuck 54 (see trapped particles 58T, FIG. 5). As shown in FIG. 5, with the wafer 40 in the transport zone 48, the trapped particles 58T are away from the wafer that is in the transport zone 48.

The force F also traps negatively charged particles 62 by urging the particles 62 upwardly to the upper electrode 52, which is out of and above the transport zone 48 (see trapped particles 62T, FIG. 5). As shown in FIG. 5, with the wafer 40 in the transport zone, and with the trapped particles 62 on the upper electrode 52, the trapped particles 62 are away from the wafer, and the wafer is subjected to fewer undesired particles 51 and is in condition for transport from the chamber 42.

The state 2 controller 72 is further configured to retain state 2 by simultaneously maintaining the positive DC potential VDC applied to the first electrode 52, by maintaining the second electrode 54 connected to ground, by continuing to supply the gas 57 to the passages 56, and by actuating the lifter pins 67 to further lift the wafer 40 (i.e., across the space 88 into the transport zone 48). While retaining state 2 in this manner, the state 2 controller 72 also initiates operation of the wafer transport unit 50 so that an end effector 74 (FIG. 5) is moved into the chamber 42 in the transport zone 48. When the end effector 74 is aligned with the wafer 40, the controller 72 causes the end effector 74 to pick the wafer up from the up position (resting on the lifter pins 67). FIG. 3 shows the wafer 40 in the up position on the lifter pins 67 (not shown in FIG. 5) in the transport zone 48 above the ESC 54. The end effector 74 picks up the wafer and then retracts through the transport zone 48, moving the wafer into the transport module 54 while carrying the wafer 40 in the transport zone 58 and while the respective trapped negative and positive particles 62 and 58 remain away from the transported wafer 40. In more detail, the wafer transport unit 50 shown in FIG. 1 may be configured for movement in the transport zone 48 and spaced from the electrodes 52 and 54 for moving the released wafer 40 out of the chamber 42. The moving of the wafer 40 is thus in the transport zone 48 with the released wafer 40 being maintained away from the particles 58 that are trapped at the electrostatic chuck 54. The released wafer 40 is also maintained away from the particles 62 that are urged toward the upper electrode 54.

FIG. 5 shows that in one embodiment the change to state 2 bias is effected by the second state controller 72 connecting a power supply 76 to the first electrode 52. The power supply 76 is configured to establish the field EF by applying the positive DC potential to the first electrode 52 with the second electrode 54 connected to ground via the switch 73. The electrostatic field EF is established between the electrodes 52 and 54 and across the transport zone 48. As configured, the power supply 76 causes the field EF to apply the electrostatic forces F. The field EF traps particular ones of the particles 51 at a particular one of the electrodes so that particles 51 in the chamber 42 are "urged away" as defined above. For example, as described above, the force F on the positively charged particles 58 (downwardly as shown in FIG. 5) traps positively charged particles 58 by holding the particles 58 to the electrostatic chuck 54. As shown in FIG. 5 the trapped particles 58 are away from the wafer 40 that is in the transport zone 48. Also as described above, the force F also traps negatively charged particles 62 by urging the particles 62 upwardly toward and to the upper electrode 52, which is out of and above the transport zone 48 and thus away from the transport zone 48.

In one embodiment, the power supply 76 shown in FIG. 5 may be configured so that the positive DC potential applied to the first (upper) electrode 52 is in a range of from about 30 volts to about 100 volts.

In another embodiment, the wafer transport unit 50 shown in FIG. 1 may be configured for movement in the transport zone 48 and spaced from the electrodes 52 and 54 for moving the released wafer 40 out of the chamber 42. The moving of the wafer 40 is thus in the transport zone 48 with the released wafer 40 being maintained away from the particles 58 that are trapped at the electrostatic chuck 54.

In review, embodiments of the present invention reduce an amount of particles 51 in the transport zone 48 in the process chamber 42, such as after plasma processing of the wafer 40. The embodiments are configured for operation in the two states, the first state being the state for processing the wafer 40. The second state is the wafer transport state for removing the processed wafer 40 from the chamber 42. The first multi-state electrode may be electrode 52 mounted in the process chamber 42. The second multi-state electrode may be the lower electrode 54 mounted in the chamber 42 spaced from the first electrode 52. By the passages 56 and the lifting pins 67 and the reduction of the chucking bias VC, the second electrode 54 is configured to de-chuck the wafer 40. FIGS. 3 & 5 show the de-chucking into the transport zone 48 after wafer processing. The electrode bias controller 68 is configured to bias the electrodes 52 and 54 for operation in each of the states, and acts through the state controllers 70 and 72. For the second (wafer transport) state the controller 68 causes the state 2 controller 72 to be configured to simultaneously (i) connect the second electrode 54 to ground, (ii) to apply the positive DC potential VDC to the first electrode 52, and (iii) to cause the second electrode 54 to de-chuck the wafer 40 to position the wafer in the transport zone 48 (e.g., via the gas 57 and the pins 67). For this second state, the controller 72 is thus configured to control the value of the positive DC potential VDC so that charged undesired particles 51 in the chamber 42 are urged away from the wafer 40 to condition the transport zone 48 for moving the wafer 40 out of the chamber 42. The wafer transporter 50 carries the de-chucked wafer 40 through the chamber 42. In state 2, the particles 51 in the chamber 42 may include the negatively charged particles 62 between the electrodes 52 and 54, for example, and the positively charged particles 58 released from the second electrode 54. The controller 72 is described as configured to maintain the positive DC potential VDC applied to the first electrode 52 and to maintain the second electrode 54 connected to ground, and to initiate operation of the wafer transporter 50 to carry the wafer 40. The maintained potential VDC and connection to ground are effective to trap the respective negative and positive particles 62 and 58 away from the wafer 40 as the transporter 50 carries the wafer through the transport zone 48.

In another embodiment, FIG. 4 shows a support 78 for mounting the respective first and second electrodes 52 and 54 spaced from each other (one support 78 being shown for the electrode 52, it being understood that a similar support is provided for the electrode 54). FIG. 5 shows the transport zone 48 between and separated from the electrodes 52 and 54. The state 2 controller 72 is described as setting the controlled value of the DC potential VDC so that negatively charged particles 62 are urged away to the first electrode 52 that is out of the transport zone 48. It may be understood that with ground connected to the second electrode 54, and with the set value VDC biasing the electrode 52, the positively charged particles 58 are urged toward the second electrode 54 and out of the transport zone 48.

In another embodiment, FIG. 5 shows the wafer transport unit 50 configured with an arm 80 that carries the end effector 74. The arm 80 is mounted for the movement into and out of the chamber 42, and to lift the wafer from and set the wafer onto the lifter pins 67. The arm 80 is configured so that this movement is in the transport zone 48. FIG. 5 also shows that the second electrode 54 may be configured as the electrostatic chuck. Chuck 54 may be provided with a wafer mount surface 82, three of the lifter pins 67 extending through the surface 82, and the passages 56 defined through the surface 82. The passages 56 are configured to guide exemplary helium gas 57 (a de-chucking gas) to the wafer to de-chuck the wafer 40 from the surface 82 into the transport zone 48 after wafer processing, as shown in FIG. 3. With the positive DC potential VDC applied to the electrode 52, the field EF is across the transport zone 48 from the first electrode 52 to the second electrode 54 to urge away charged particles 51 out of the transport zone 48 so that the processed and de-chucked wafer 40 moved by the arm 80 in the transport zone 48 is subjected to the reduced amount of charged particles 51.

Figure 6:
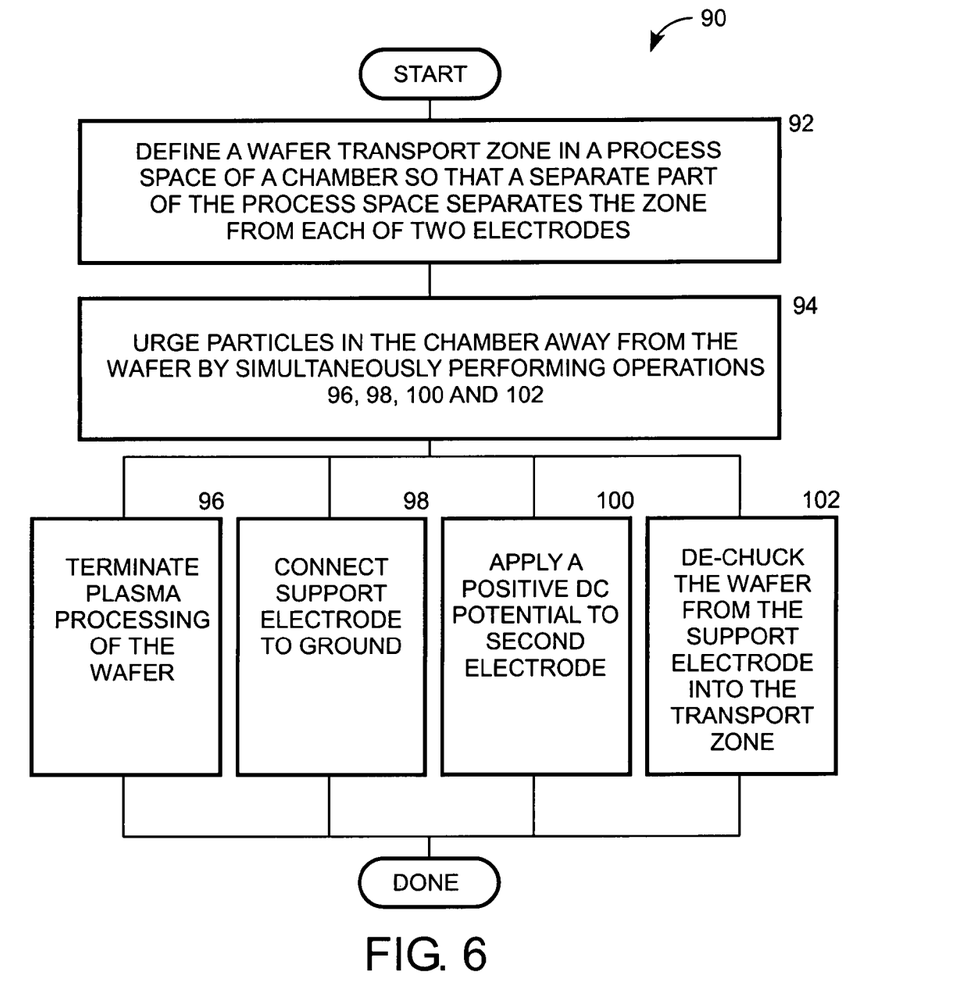
FIG. 6 illustrates a flow chart of a method in accordance with one embodiment of the present invention.

In another embodiment of the present invention, a method is provided for preparing a process chamber for transporting a processed wafer from the process chamber. The chamber may be the chamber 42 and the wafer may be the wafer 40 to be transported in the transport zone 48 when the wafer 40 is removed from the support electrode 54 that mounts the wafer 40 for the processing. FIG. 3 shows that the processing tends to release the undesired particles 51 into a process space 86 in the chamber 42. In FIG. 5 the electrode 54 is shown opposite to the support electrode 52 and the electrodes 52 and 54 define the process space 86. FIG. 6 illustrates a flow chart 90 of the method, which may move from start to an operation 92 of defining a wafer transport zone in the process space so that a separate part of the process space separates the zone from each of the electrodes. The wafer transport zone may be the zone 48, which is in the process space 86. FIG. 5 shows that a separate part 88 of the process space 86 may separate the transport zone 48 from each of the electrodes 52 and 54. The method may move to an operation 94 of urging particles in the chamber away from the wafer by simultaneously performing certain further operations. The urging may be of undesired particles 51, including positively charged particles 58 and negatively charged particles 62. The certain further operations of operation 94 are shown including an operation 96 of terminating plasma processing of the wafer. Operation 96 may be performed as described above by the controller 68, which is configured to start state 2 controller 72 and to cause state 1 controller 70 to terminate operation of plasma processing of the wafer 40. As described above, termination of that plasma processing results in switching off of the state 1 electrode bias VRF (i.e., terminating that bias).

Operation 94 of urging particles in the chamber away from the wafer by simultaneously performing certain further operations may further include an operation 98. Operation 98 connects the support electrode to ground. The support electrode is the lower electrode 54 that supports the wafer 40. For the second (wafer transport) state the controller 68 may cause the controller 72 to be configured to connect the second electrode 54 to ground as shown in FIG. 5.

Operation 94 of urging particles in the chamber away from the wafer by simultaneously performing certain further operations may further include an operation 100. Operation 100 may apply the positive DC potential VDC to the electrode 52. Again, for the wafer transport state the controller 68 may cause the controller 72 to apply the potential VDC to the upper electrode 52 as shown in FIG. 5.

Operation 94 of urging particles in the chamber away from the wafer by simultaneously performing certain further operations may further include an operation 102. Operation 102 may cause the second electrode 54 to de-chuck the wafer 40 to position the wafer in the transport zone 48 (as shown in FIG. 3). Again, for the wafer transport state the controller 68 may cause the controller 72 to reduce the chucking bias VC, to cause the supply of the gas 56 to the lower electrode (the chuck) 54, and to actuate the lifter pins 67. This causes the second electrode 54 to de-chuck the wafer 40 and to position the wafer in the transport zone 48, and the method is done.

For the second state, these operations 96, 98, 100, and 102 enable the controlled value of the positive DC potential VDC to urge charged particles 51 in the chamber 42 away from the wafer 40 to condition the transport zone 48 for moving the wafer 40 out of the chamber 42. The wafer transporter 50 lifts and then carries the de-chucked wafer 40 through the chamber 42 in the transport zone 48, which is away from the undesired particles 51. As described above, in state 2 the particles 51 in the chamber 42 may include the negatively charged particles 62 between the electrodes 52 and 54, for example, and the positively charged particles 58 released from the second electrode 54. The positive DC potential VDC is maintained applied to the first electrode 52, and may be at the positive DC potential in the range of from about 30 volts to about 100 volts. The second electrode 54 is maintained connected to ground. The wafer 40 remains de-chucked after being moved from the support electrode 54 across one of the separate parts 88 (the lower part 88) of the process space 86 and into the transport zone 48 away from the particles 51 that are urged away from the transport zone. Then, the operation of the wafer transporter 50 to carry the wafer 40 may be initiated. The maintained potential VDC and connection to ground are effective to continue to urge the particles away from the transport zone 48 and trap the respective negative and positive particles 62 and 58 away from the wafer 40 as the transport unit 50 carries the wafer through the transport zone 48.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. Apparatus for trapping particles away from a wafer transport zone in a process chamber after plasma processing of the wafer, the apparatus comprising:
   a first electrode mounted in the process chamber on one side of the transport zone;
   a second electrode mounted in the chamber spaced from the first electrode on an opposite side of the transport zone; and
   a power supply connected to the first electrode to establish an electrostatic field between the electrodes and across the transport zone, the field trapping particular ones of the particles at a particular one of the electrodes so that particles in the chamber are urged away from the transport zone, wherein the second electrode is configured as an electrostatic chuck to mount the wafer in the chamber for processing and tends to release positively charged particles into the transport zone of the chamber, the electrostatic chuck is configured to supply gas against the wafer to release the wafer from the electrostatic chuck to facilitate moving the wafer into the transport zone;
   wherein the power supply is configured to establish the field by applying a positive DC potential to the first electrode with the electrostatic chuck connected to ground, the configured power supply causing the field to apply an electrostatic forces that trap positively charged particles at the electrostatic chuck away from the wafer in the transport zone.

2. Apparatus as recited in claim 1, wherein:
   the power supply is configured to establish the field by applying a positive DC potential to the first electrode with the second electrode connected to ground.

3. Apparatus as recited in claim 2, wherein:
   negatively charged particles tend to be in the chamber after the plasma processing of the wafer; and
   the configured power supply causes the field to apply electrostatic forces on the negatively charged particles, the forces urging the negatively charged particles against the first electrode and away from the transport zone.

4. Apparatus as recited in claim 3, wherein the positive DC potential is in a range of from about 30 volts to about 100 volts.

5. Apparatus as recited in claim 2, wherein:
   the second electrode is configured to electrostatically mount the wafer in the chamber for processing;
   the second electrode tends to release positively charged particles into the transport zone of the chamber; and
   the configured power supply causes the field to apply electrostatic forces on the positively charged particles, the forces urging the positively charged particles toward the second electrode and away from the transport zone.

6. Apparatus as recited in claim 5, wherein the positive DC potential is in a range of from about 30 volts to about 100 volts.

7. Apparatus as recited in claim 1, wherein:
   the particles in the chamber comprise negatively charged particles in the transport zone between the electrodes and positively charged particles that are releasable from the second electrode; and
   the power supply is configured to establish the field, the field being established by applying a positive DC potential to the first electrode with the second electrode connected to ground, the field applying electrostatic forces that hold negatively charged particles against the first electrode and away from the transport zone, the forces urging positively charged particles toward the second electrode and away from the transport zone.

8. Apparatus as recited in claim 1, the apparatus further comprising:
   a wafer transport unit configured for movement in the transport zone and spaced from the electrodes for moving the released wafer out of the chamber, the moving being in the transport zone with the released wafer being maintained away from the particles that are trapped at the electrostatic chuck.

9. Apparatus as recited in claim 8, wherein:
   negatively charged particles tend to be in the chamber after plasma processing of a wafer; and
   the configured power supply causes the field to apply electrostatic forces between the electrodes to urge negatively charged particles against the first electrode and away from the wafer moved by the wafer transport unit.

10. Apparatus for reducing an amount of particles in a transport zone in a process chamber after plasma processing of a wafer, the apparatus being configured for operation in two states, a first state being a state for processing the wafer, a second state being a wafer transport state for removing the processed wafer from the chamber, the apparatus comprising:
    a first multi-state electrode mounted in the process chamber;
    a second multi-state electrode mounted in the chamber spaced from the first electrode, the second electrode being configured to de-chuck the wafer into the transport zone after wafer processing; and an electrode bias controller configured to bias the electrodes for operation in each of the states, for the wafer transport state the controller being configured to simultaneously (i) connect the second electrode to ground, (ii) apply a positive DC potential to the first electrode, and (iii) cause the second electrode to de-chuck the wafer to facilitate positioning the wafer in the transport zone;

wherein, for the second state, the controller is configured to control a value of the positive DC potential so that charged particles in the chamber are urged away from the wafer to condition the transport zone for moving the wafer out of the chamber.

11. Apparatus as recited in claim 10, the apparatus further comprising a wafer transporter for carrying the de-chucked wafer through the transport zone; and wherein:

the particles in the chamber comprise negatively charged particles between the electrodes and positively charged particles released from the second electrode; and the controller is further configured to maintain the positive DC potential applied to the first electrode and to maintain the second electrode connected to ground and to initiate operation of the wafer transporter to carry the wafer, the maintained potential and connection to ground being effective to urge negative and positive particles away from the wafer as the transporter carries the wafer through the transport zone.

12. Apparatus as recited in claim 10, wherein the particles in the chamber comprise negatively charged particles between the electrodes and positively charged particles released from the second electrode; the apparatus further comprising:

supports for mounting the first and second electrodes spaced from each other with the transport zone between and separated from the electrodes; wherein:

the controller sets the controlled value of the DC potential so that negatively charged particles are urged away to the first electrode out of the transport zone; and with the ground connection and with the set value biasing the respective electrodes, the positively charged particles are urged toward the second electrode and out of the transport zone.

13. Apparatus as recited in claim 10, the apparatus further comprising a wafer transport arm mounted for movement into and out of the chamber, the arm being configured so that the movement is in the transport zone; and wherein:

the second electrode is configured as an electrostatic chuck provided with a wafer mount surface and with passages defined through the surface, the passages being configured to guide a de-chucking gas to the wafer to de-chuck the wafer from the surface and facilitate wafer movement into the transport zone after wafer processing; and the positive DC potential is across the transport zone from the first electrode to the second electrode to urge away charged particles out of the transport zone so that the processed and de-chucked wafer moved by the arm in the transport zone is subjected to a reduced amount of charged particles.

14. Apparatus as recited in claim 10, wherein the controller is configured to apply the positive DC potential in a range of from about 30 volts to about 100 volts.

15. A method of preparing a process chamber for transporting a processed wafer from the process chamber, a support electrode mounting the wafer for the processing, the processing tending to release undesired particles into a process space in the chamber, a second electrode opposite to the support electrode defining the process space; the method comprising the operations of:

defining a wafer transport zone in the process space so that a separate part of the process space separates the zone from each of the electrodes; and urging particles in the chamber away from the wafer by simultaneously performing the further operations of:
(i) terminating plasma processing of the wafer,
(ii) connecting the support electrode to ground,
(iii) applying a positive DC potential to the second electrode, and
(iv) de-chucking the wafer from the support electrode into the transport zone.

16. A method as recited in claim 15, wherein:

particles in the process space comprise negatively charged particles and positively charged particles; and the further operations of connecting and applying urge the particles out of the transport zone.

17. A method as recited in claim 16, wherein the further operation of de-chucking is by moving the wafer from the support electrode across one of the separate parts of the process space and into the transport zone away from the particles that are urged away from the transport zone.

18. A method as recited in claim 15, wherein the further operation of applying applies the positive DC potential in a range of from about 30 volts to about 100 volts.

* * * * *